(12) United States Patent
Yang

(10) Patent No.: US 11,205,661 B2
(45) Date of Patent: Dec. 21, 2021

(54) THREE-DIMENSIONAL MEMORY DEVICES WITH ENLARGED JOINT CRITICAL DIMENSION AND METHODS FOR FORMING THE SAME

(71) Applicant: YANGTZE MEMORY TECHNOLOGIES CO., LTD., Wuhan (CN)

(72) Inventor: Yonggang Yang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/860,890

(22) Filed: Apr. 28, 2020

(65) Prior Publication Data
US 2021/0225861 A1    Jul. 22, 2021

Related U.S. Application Data

(63) Continuation of application No. PCT/CN2020/073359, filed on Jan. 21, 2020.

(51) Int. Cl.
| | |
|---|---|
| *H01L 27/11582* | (2017.01) |
| *H01L 21/28* | (2006.01) |
| *H01L 21/02* | (2006.01) |
| *H01L 21/311* | (2006.01) |
| *H01L 27/11524* | (2017.01) |

(Continued)

(52) U.S. Cl.
CPC .... *H01L 27/11582* (2013.01); *H01L 21/0223* (2013.01); *H01L 21/02164* (2013.01); *H01L 21/02255* (2013.01); *H01L 21/31111* (2013.01); *H01L 27/1157* (2013.01); *H01L 27/11524* (2013.01); *H01L 27/11556* (2013.01); *H01L 29/40114* (2019.08); *H01L 29/40117* (2019.08);

(Continued)

(58) Field of Classification Search
CPC ......... H01L 27/11582; H01L 29/40114; H01L 29/40117; H01L 21/02164; H01L 21/0223; H01L 21/02255; H01L 21/31111; H01L 27/11524; H01L 27/11556; H01L 27/1157; H01L 29/42324; H01L 29/4234
See application file for complete search history.

(56) References Cited

U.S. PATENT DOCUMENTS

| | | |
|---|---|---|
| 2010/0314678 A1 | 12/2010 | Lim et al. |
| 2016/0079269 A1 | 3/2016 | Sekine et al. |

(Continued)

FOREIGN PATENT DOCUMENTS

| | | |
|---|---|---|
| CN | 103247632 A | 8/2013 |
| CN | 106328657 A | 1/2017 |

(Continued)

*Primary Examiner* — Mohammad M Choudhry
(74) *Attorney, Agent, or Firm* — Bayes PLLC

(57) ABSTRACT

Embodiments of three-dimensional (3D) memory devices with an enlarged joint critical dimension and methods for forming the same are disclosed. In an example, a 3D memory device is disclosed. The 3D memory device includes a substrate, a memory stack having a plurality of interleaved conductor layers and dielectric layers on the substrate, and a memory string extending vertically through the first memory stack and having a memory film along a sidewall of the memory string. The memory film includes a discontinuous blocking layer interposed by the dielectric layers.

20 Claims, 10 Drawing Sheets

(51) Int. Cl.
 *H01L 27/11556* (2017.01)
 *H01L 27/1157* (2017.01)
 *H01L 29/423* (2006.01)

(52) U.S. Cl.
 CPC .... *H01L 29/4234* (2013.01); *H01L 29/42324* (2013.01)

(56) References Cited

U.S. PATENT DOCUMENTS

2016/0133643 A1    5/2016  Choi et al.
2017/0243879 A1*  8/2017  Yu ........................ H01L 27/1157
2018/0175051 A1    6/2018  Lue et al.
2018/0331117 A1* 11/2018  Titus ................. H01L 27/11565

FOREIGN PATENT DOCUMENTS

| | | |
|---|---|---|
| CN | 107548520 A | 1/2018 |
| CN | 108886041 A | 11/2018 |
| CN | 109155313 A | 1/2019 |
| CN | 109417074 A | 3/2019 |
| CN | 109712980 A | 5/2019 |
| CN | 110600476 A | 12/2019 |
| CN | 110707094 A | 1/2020 |
| TW | 201834207 A | 9/2018 |
| TW | 201834221 A | 9/2018 |

\* cited by examiner

THREE-DIMENSIONAL MEMORY DEVICES WITH ENLARGED JOINT CRITICAL DIMENSION AND METHODS FOR FORMING THE SAME

CROSS-REFERENCE TO RELATED APPLICATIONS

This application is continuation of International Application No. PCT/CN2020/073359, filed on Jan. 21, 2020, entitled "THREE-DIMENSIONAL MEMORY DEVICES WITH ENLARGED JOINT CRITICAL DIMENSION AND METHODS FOR FORMING THE SAME," which is hereby incorporated by reference in its entirety.

BACKGROUND

Embodiments of the present disclosure relate to three-dimensional (3D) memory devices and fabrication methods thereof, particularly with respect to 3D memory devices with an enlarged joint critical dimension (CD) and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array. It has the advantage of occupying less wafer area than the planar memory sells for the same bit density. The memory string in the 3D memory architecture differs from that in the planar memory sells in that the string is arranged vertically above the substrate.

However, as the cell size continues to shrink, various issues arise with respect to the cost, reliability, and performance of the existing 3D memory structure and manufacturing method. Thus, novel 3D memory devices and fabrication methods thereof are needed to resolve these issues.

SUMMARY

Embodiments of 3D memory devices having an enlarged joint critical dimension and methods for forming the same are disclosed herein.

In one example, a 3D memory device is disclosed, which includes a substrate, a memory stack having a plurality of interleaved conductor layers and dielectric layers on the substrate, and a memory string extending vertically through the first memory stack and having a memory film along a sidewall of the memory string. The memory film includes a discontinuous blocking layer interposed by the dielectric layers.

In another example, a 3D memory device is disclosed, which includes a substrate, a memory stack having a plurality of interleaved conductor layers and dielectric layers on the substrate, and a memory string extending vertically through the first memory stack and having a memory film along a sidewall of the memory string. The memory film includes a discontinuous blocking layer interposed by the dielectric layers. The discontinuous blocking layer has multiple sections, and none of the adjacent sections is contiguous with each other.

In yet another example, a method for forming a 3D memory device is disclosed. A dielectric deck comprising interleaved sacrificial layers and dielectric layers is formed on a substrate. An opening extending vertically through the first dielectric deck is formed. A side of the sacrificial layers that abuts a sidewall of the opening is etched. A discontinuous blocking layer is formed at the locations where the sacrificial layers are etched. A storage layer, a tunneling layer, and a semiconductor channel is subsequently formed over the discontinuous blocking layer and the interposed dielectric layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
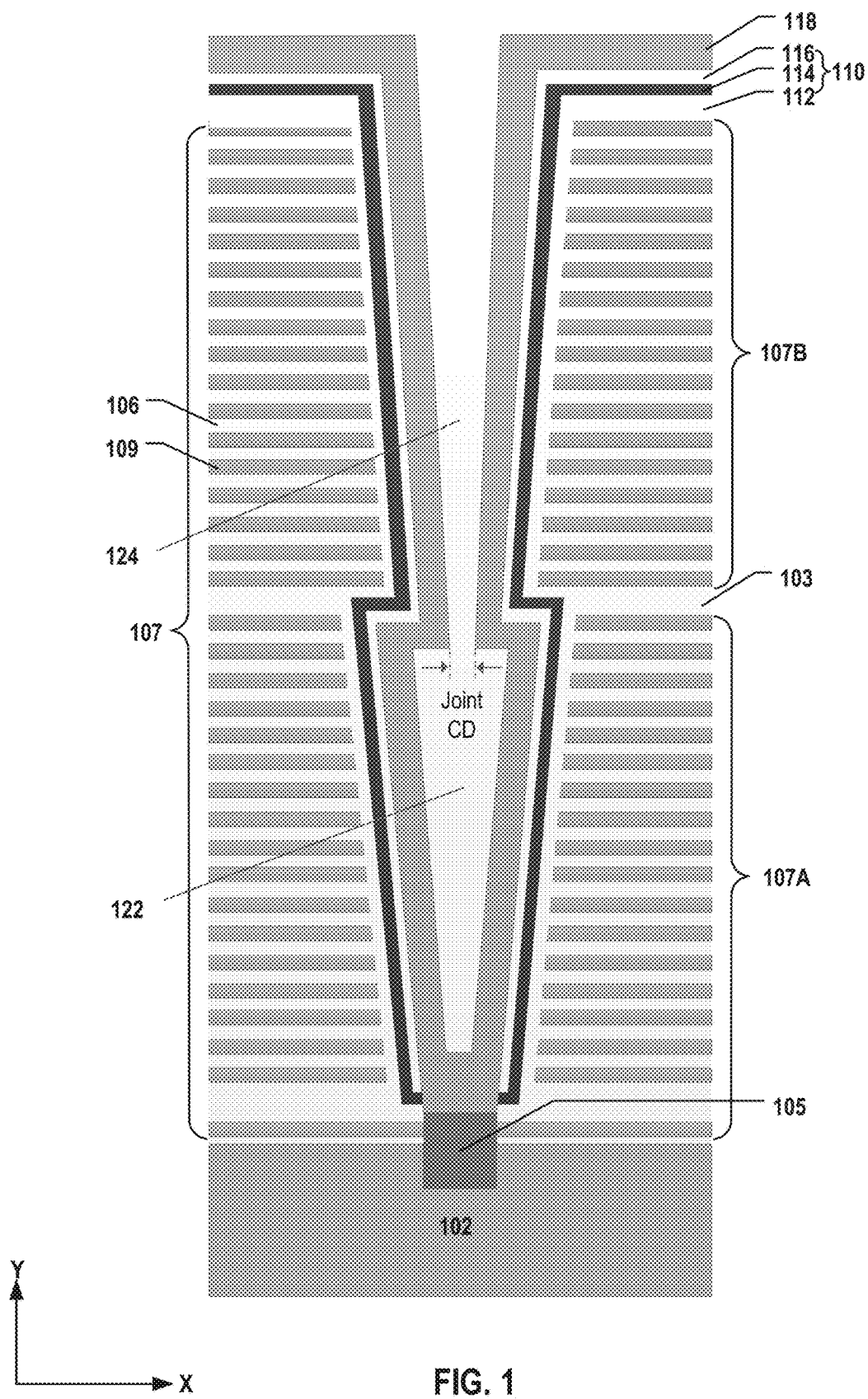
FIG. 1 illustrates a cross-section view of an exemplary 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," "other embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In fabricating 3D NAND memory devices with advanced technologies, such as having 96 or more levels, a dual-deck architecture is usually used, which includes two stacked channel structures that can be electrically connected by an inter-deck plug structure. Before the formation of the inter-deck plug structure, a window at the inter-deck joint may be opened to allow various processes to be carried out in the lower channel holes of the architecture. However, the joint CD has decreased significantly as a result of the continuing shrinkage of the cell size, thus narrowing the window at the inter-deck joint to the point where the chemicals necessary for those processes are difficult to enter the lower channel holes.

FIG. 1 illustrates a cross-section view of an exemplary 3D memory device 100. 3D memory device 100 during the fabrication process includes a NAND memory string extending vertically through a dual-deck memory stack 107 (including a lower memory deck 107A and an upper memory deck 107B). Each of lower and upper memory decks 107A and 107B includes a plurality of pairs, each pair including a dielectric layer 106 and a conductor layer 109 (referred to herein as "conductor/dielectric layer pairs") formed above a substrate 102. Lower and upper memory decks 107A and 107B are separated by a joint oxide layer 103. A channel structure including an upper channel hole 124 and a lower channel hole 122 is formed through upper memory deck 107B and lower memory deck 107A, respectively, in which the NAND memory string can be formed.

Substrate 102 includes silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. It is noted that x and y axes are included in FIG. 1 to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 102) in the y-direction (i.e., the vertical direction) when the substrate is positioned in the lowest plane of the 3D memory device in the y-direction. The same notion for describing spatial relationship is applied throughout the present disclosure.

Each NAND memory string includes a memory film 110 that extends vertically through both upper and lower memory decks 107B and 107A. Memory film 110 includes a tunneling layer 116, a storage layer 114 (also known as a "charge trap layer"), and a blocking layer 112. The NAND memory string further includes a semiconductor channel 118, which is formed by filling in semiconductor material(s) in the channel structure. A semiconductor plug 105 is provided in the lower portion of the NAND memory string that is in contact with semiconductor channel 118 and functions as a channel controlled by a source select gate of the NAND memory string.

The diameter of the cylinder shape at the location of joint oxide layer 103 is denoted as a joint critical dimension (CD), as shown in FIG. 1. The value of the joint CD may have a direct impact on how likely the various chemicals may pass through the joint from upper channel hole 124 to lower channel hole 122, because the joint CD is usually the smallest among all CDs in the upper portion of the channel structure. The conventional technology faces an issue of narrow joint CD because the memory film (e.g., memory film 110) along the sidewall of the channel structure is so thick that it takes up much of the opening at the joint CD, thus making it difficult for materials to enter the lower portion of the channel structure. For example, when wet chemicals used for etching silicon oxide in the lower portion of the channel structure fail to get into the lower portion, under-etching may result in extremely thick layers over the polysilicon at the bottom of the lower portion of the channel structure. In another example, when wet chemicals for cleaning the polysilicon semiconductor channel after its formation are difficult to be removed from the lower portion, over-etching may cause damage to the polysilicon. In yet another example where dry etching is applied, a narrow joint CD may lead to under-etching of the oxide-nitride-oxide (ONO) film at the bottom of the lower portion of the channel structure. This may further cause the failure of defect inspection, such as dark voltage contrast (DVC) failure. None of these cases are ideal in the semiconductor fabrication process.

Various embodiments in accordance with the present disclosure provide an effective structure and method for enlarging the joint CD. More particularly, at least a portion of silicon nitride layers abutting the sidewall of channel holes are etched and then oxidized to form native oxide layers prior to the deposition of memory films. Thus, the CD of the channel holes adjacent to the joint between two decks can be enlarged, and further processes can be performed in the lower channel holes of the architecture.

Figure 2A:
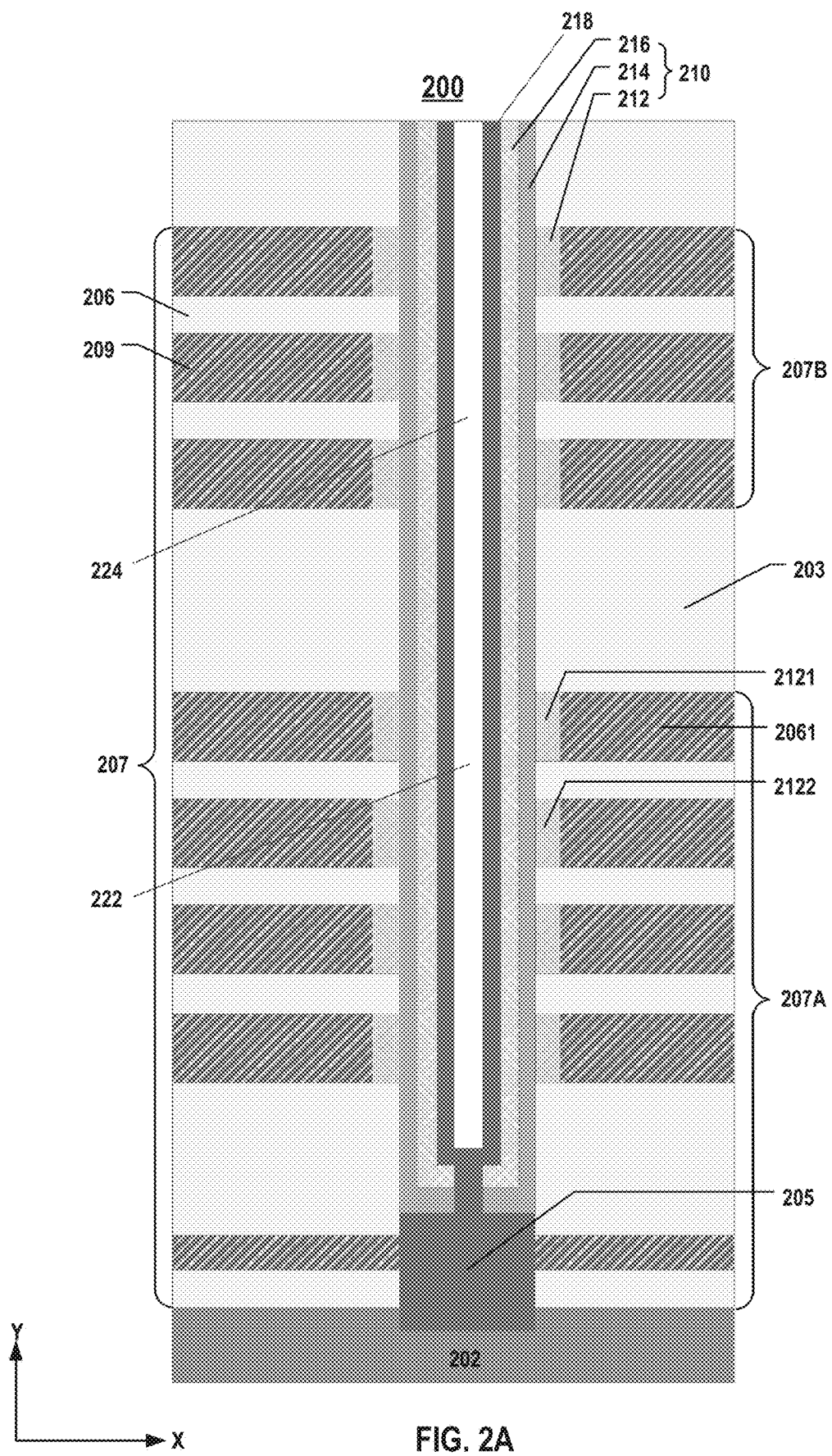
FIG. 2A illustrates a cross-section of an exemplary 3D memory device with an enlarged joint critical dimension, according to some embodiments of the present disclosure.

FIG. 2A illustrates a cross-section view of an exemplary 3D memory device 200 having an enlarged joint CD, according to some embodiments of the present disclosure. As 3D memory device 100 illustrated in FIG. 1, 3D memory device 200 in FIG. 2A may also include a substrate 202 that has the same or similar characteristics and implementations as substrate 102 in FIG. 1. Thus, the descriptions of substrate 102 may be similarly applied here and thus will not be repeated.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

According to embodiments of the present disclosure, 3D memory device 200 is a NAND Flash memory device in which memory cells are provided in the form of an array of NAND memory strings each extending vertically above substrate 202. Each NAND memory string can extend through a plurality of pairs of layers, each pair including a dielectric layer 206 and a conductor layer 209 (referred to herein as "conductor/dielectric layer pairs") formed above substrate 202 during the fabrication process. FIG. 2A shows a dual-deck memory stack 207 (including a lower memory deck 207A and an upper memory deck 207B) through which a NAND memory string extends vertically. The number of the conductor/dielectric layer pairs in memory stack 207 (e.g., 32, 64, 96, 128, or any other number compatible with the present disclosure) can set the number of memory cells in 3D memory device 200. As shown in FIG. 2A, lower and upper memory decks 207A and 207B can be separated by a joint oxide layer 203.

In some embodiments, a dielectric stack (not shown) is formed in the middle of the fabrication process, which includes a plurality of pairs of layers, each pair including a dielectric layer (i.e. dielectric layer 206) and a sacrificial layer. Towards the end of the fabrication process, memory stack 207 replaces the dielectric stack by a gate replacement process, which replaces each sacrificial layer with a conductor layer (i.e. conductor layer 209). After the gate replacement, conductor layers 209 and dielectric layers 206 in memory stack 207 can alternate in the vertical direction, thus creating a memory stack that includes a plurality of interleaved conductor layers 209 and dielectric layers 206 over substrate 202. In other words, except the ones at the top and the bottom of the memory stack, each conductor layer 209 can be adjoined by two dielectric layers 206 on both sides, and each dielectric layer 206 can be adjoined by two conductor layers 209 on both sides. Conductor layers 209 can each have the same thickness or have different thicknesses. Similarly, dielectric layers 206 can each have the same thickness or have different thicknesses. Likewise, conductor layers 209 and dielectric layers 206 can each have the same thickness or have different thicknesses. Conductor layers 209 can include conductive materials including, but not limited to, tungsten (W), cobalt (Co), copper (Cu), aluminum (Al), polysilicon, doped silicon, silicides, or any combination thereof. Dielectric layers 206 can include dielectric materials including, but not limited to, silicon oxide, silicon nitride, silicon oxynitride, or any combination thereof. In some embodiments, an insulation layer (not shown) is formed between substrate 202 and the memory stack and includes dielectric materials, such as silicon oxide.

According to embodiments of the present disclosure, a channel structure including an upper channel hole 224 and a lower channel hole 222 can be formed through upper memory deck 207B and lower memory deck 207A, respectively, in which the NAND memory string can be formed. The NAND memory string can also include a memory film 210 that extends vertically through both upper and lower memory decks 207B and 207A and along a sidewall of the NAND memory string. Memory film 210 can include a tunneling layer 216, a storage layer 214 (also known as a "charge trap layer"), and a blocking layer 212. Tunneling layer 216 can include silicon oxide, silicon oxynitride, or any combination thereof. Storage layer 214 can include silicon nitride, silicon oxynitride, silicon, or any combination thereof. Blocking layer 212 can include silicon oxide, silicon oxynitride, high dielectric constant (high-κ) dielectrics, or any combination thereof. In one example, memory film 210 can include a composite layer of silicon oxide/silicon oxynitride/silicon oxide (ONO).

As shown in FIG. 2A, the NAND memory string of 3D memory device 200 can further include a semiconductor channel 218, which can be formed by filling semiconductor material(s) in the channel structure. In some embodiments, semiconductor channel 218 can include silicon, such as amorphous silicon, polysilicon, or single crystalline silicon. In the subsequent process, the remaining space of channel holes 222 and 224 can be partially or fully filled with a filling layer including dielectric materials, such as silicon oxide. Similar to that of 3D memory device 100, the channel structure of 3D memory device 200 can also have a cylinder shape (e.g., a pillar shape). The filling layer, semiconductor channel 218, tunneling layer 216, storage layer 214, and blocking layer 212 may be arranged radially from the center toward the outer surface of the pillar in this order, according to some embodiments.

In some embodiments, a semiconductor plug 205 is provided in the lower portion (e.g., at the lower end) of the NAND memory string. As used herein, the "upper end" of a component (e.g., the NAND memory string) is the end farther away from substrate 202 in the y-direction, and the "lower end" of the component (e.g., the NAND memory string) is the end closer to substrate 202 in the y-direction when substrate 202 is positioned in the lowest plane of 3D memory device 200. Semiconductor plug 205 can include a semiconductor material, such as silicon, which is epitaxially grown from substrate 202 in any suitable directions. It is understood that in some embodiments, semiconductor plug 205 includes single crystalline silicon, the same material of substrate 202. In other words, semiconductor plug 205 can include an epitaxially-grown semiconductor layer that is the same as the material of substrate 202. In some embodiments, part of semiconductor plug 205 is above the top surface of substrate 202 and in contact with the semiconductor channel. Semiconductor plug 205 can function as a channel controlled by a source select gate of the NAND memory string.

According to embodiments consistent with the present disclosure, blocking layer 212 may be a discontinuous blocking layer interposed by dielectric layers 206. As shown in FIG. 2A, blocking layer 212 may include multiple small sections, with adjacent sections along the vertical direction being separated by dielectric layers 206. In some embodiments, the number of small sections may be equal to the number of conductor layers 209 along the vertical direction. Each small section abuts storage layer 214 on one end and abuts a side of one layer of conductor layer 209 on the other end, and is located in the recess of that conductor layer 209 surrounded by two adjacent dielectric layers 206 and one side of that conductor layer 209. Each small section of discontinuous blocking layer 212 may be formed by etching a side of a sacrificial layer (which is subsequently replaced with a conductor layer 209) that abuts a sidewall of the channel structure and then forming an oxide layer by oxidization processes, such as thermal oxidation or wet chemical oxidation (e.g., using chemicals containing ozone), which will be described in detail below in conjunction with FIGS. 3A-3F.

Blocking layer 212 shown in FIG. 2A is fully discontinuous, meaning that none of the adjacent small sections of blocking layer 212 is contiguous with each other. For example, small section 2121 and small section 2122 are adjacent small sections of blocking layer 212 in FIG. 2A, and they are entirely separated by one dielectric layer 2061 and covered by storage layer 214.

Figure 2B:
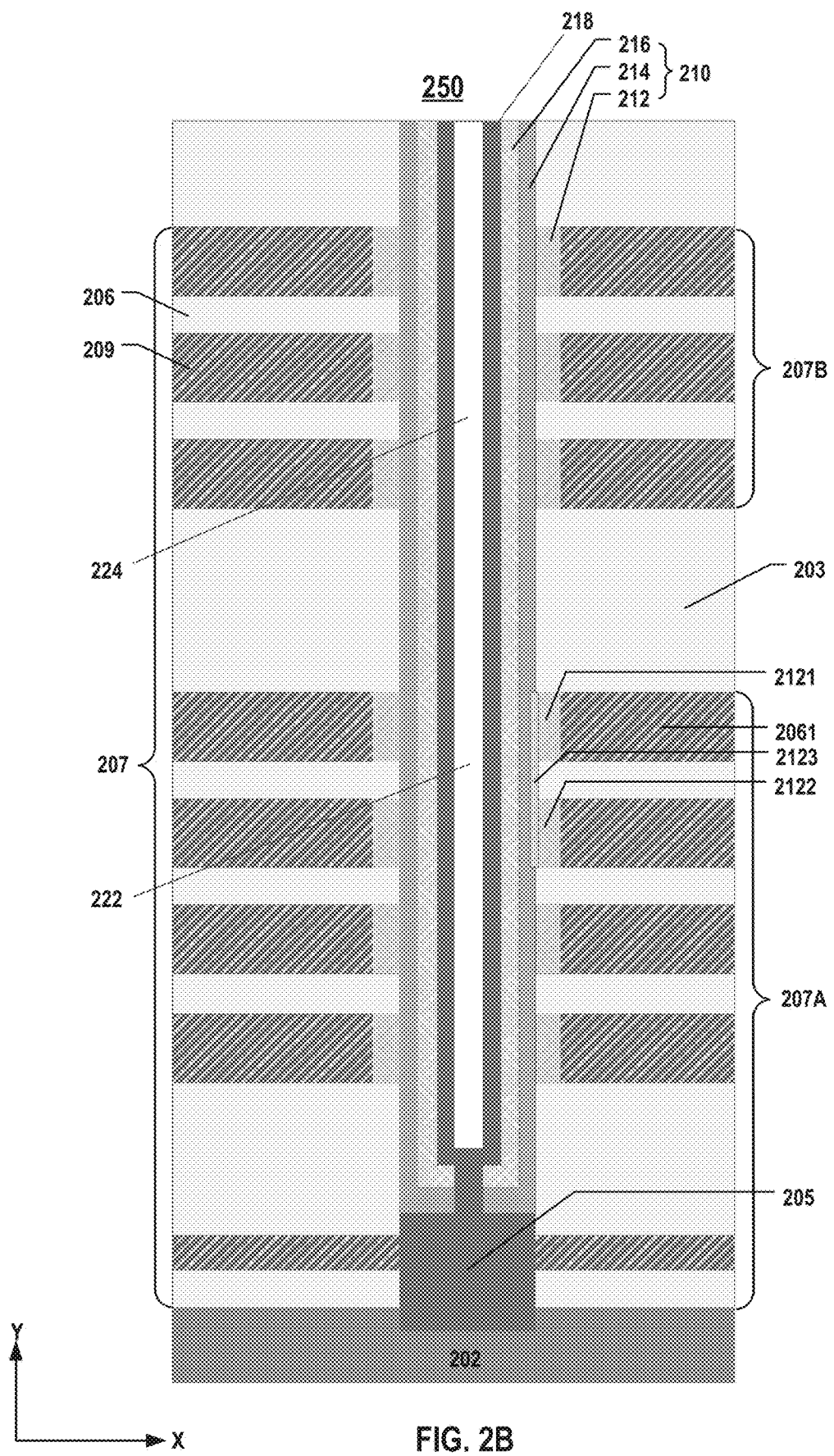
FIG. 2B illustrates a cross-section of another exemplary 3D memory device with an enlarged joint critical dimension, according to some embodiments of the present disclosure.

According to some other embodiments consistent with the present disclosure, blocking layer 212 shown in FIG. 2B may be partially discontinuous, meaning that at least two adjacent small sections (e.g., small sections 2121 and 2122) are connected via a contiguous vertical layer 2123 that protrudes from the small sections and covers a side of a dielectric layer 2061 positioned between the two adjacent small sections. The contiguous vertical layer may be formed by the same oxidization process that forms small sections 2121 and 2122 of discontinuous blocking layer 212, and may protrude as a result of shallow recesses created by etching sacrificial layers prior to the formation of small sections 2121 and 2122 in those recesses. In yet some other embodiments, more than two adjacent small sections, such as three, four, five, ten, or all small sections, can be connected via one or more contiguous vertical layers. The other parts of 3D memory device 250 in FIG. 2B are similar to those of 3D memory device 200 described in conjunction with FIG. 2A, and thus their locations and functionalities will not be repeated herein.

Referring back to FIG. 2A, in some embodiments in which dielectric layers 206 include silicon oxide and sacrificial layers include silicon nitride, blocking layer 212 may include silicon oxide. It is understood that depending on the oxidization processes (e.g., the extent to which nitrogen atoms and ions are removed from the native oxide), the native oxide can be entirely silicon oxide, entirely silicon oxynitride, and a mixture of silicon oxide and silicon oxynitride. As a result, in some embodiments, blocking layer 212 includes both silicon oxide and silicon oxynitride.

Because discontinuous blocking layer 212 may include a plurality of small sections that are formed in the recesses of conductor layers 209 in dual-deck memory stack 207, the overall thickness of memory film 210 that protrudes from the sidewall of the channel structure can be significantly reduced, thereby enlarging the CD of lower and upper channel holes 222 and 224 and also the joint CD at or near joint oxide layer 203. The enlarged joint window makes it easier for chemicals to enter lower channel holes 222 during various processes carried out in the lower portion of the channel structure, thus suppressing the occurrence of over-etching and under-etching, as discussed above.

In some embodiments, the thickness of discontinuous blocking layer 212, measured by the horizontal width between one end abutting storage layer 214 and the other end abutting a side of one conductor layer 209, may be between about 4 nm and about 10 nm, such as between 4 nm and 10 nm (e.g., 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, any range bounded by the lower end by any of these values, or in any range defined by any two of these values). In some embodiments, discontinuous blocking layer 212 may have a thickness between about 6 nm and about 8 nm, which is closer to the thickness of 7 nm in blocking layer 112 (shown in FIG. 1) and thus no significant change in subsequent manufacturing processes are needed. According to the present disclosure, since sections of blocking layer 212 may be formed in the recesses of conductor layers 209, the CD of lower and upper channel holes 222 and 224 and the joint CD at or near joint oxide layer 203 may have a gain of twice the saved thickness of blocking layer 212, which ranges between about 8 nm and about 20 nm. Compared with FIG. 1, the CD and the joint CD may have a gain of about 14 nm.

Although embedded discontinuously in the recesses of conductor layers 209, the blocking capability of blocking layer 212 according to the present disclosure does not become inferior to blocking layers of prior technology, thanks to interposed dielectric layers 206, the side of which may also provide blocking capability. Dielectric layers 206 may include dielectric materials (e.g., silicon oxide, silicon nitride, silicon oxynitride, or any combination thereof) similar to that of blocking layer 212. Thus, in the present disclosure, discontinuous blocking layer 212 and dielectric layers 206 collectively form a continuous blocking layer along the sidewall of the channel structure.

In some embodiments, discontinuous blocking layer 212 may, as part of memory film 210, extend through both upper and lower memory decks 207B and 207A vertically and along a sidewall of the NAND memory string, as shown in FIG. 2A. This configuration has the advantage of preventing the entire sidewall of the channel structure from being etched in the subsequent fabrication process.

In some embodiments, the sidewall of discontinuous blocking layer 212 may be substantially flush with the sidewall of joint oxide layer 203. This configuration makes it possible to achieve thickness uniformity of storage layer 214 and/or tunneling layer 216 in the joint CD area. As a result, memory film 210 is unlikely to have breakage in the joint CD area, which would otherwise cause defects in 3D memory device 200. The term "flush with" as used herein describes the evenness of a surface formed by two adjacent sidewalls. The term "substantially," when used in describing the relative position between the sidewall of discontinuous blocking layer 212 and the sidewall of joint oxide layer 203, means the sidewalls of the two layers may be completely flush or have a small shift between each other of no more than about ±1 nm (e.g., ±0.1 nm, ±0.2 nm, ±0.5 nm, ±1 nm, any range bounded by the lower end by any of these values, or in any range defined by any two of these values). This is because sometimes the fabrication process may not be precise enough to make the sidewalls of the two layers align with each other. Nevertheless, as long as the intended result of the present disclosure is obtained, it is not required to have an absolute alignment of the sidewalls of different layers.

In some embodiments, the sidewall of discontinuous blocking layer 212 may be substantially flush with the sidewall of dielectric layers 206. Similar to the embodiments above, this configuration makes it possible to achieve thickness uniformity of storage layer 214 and/or tunneling layer 216 in the entire vertical area across the channel structure. As a result, memory film 210 is unlikely to have breakage in the channel structure, which would otherwise cause defects in 3D memory device 200.

FIGS. 3A-3E illustrate an exemplary fabrication process for forming a 3D memory device 300 with an enlarged joint CD, according to some embodiments of the present disclosure. FIG. 4 illustrates a flowchart of an exemplary method 400 for forming a 3D memory device with an enlarged joint CD, according to some embodiments of the present disclosure. Examples of the 3D memory device 300 depicted in FIGS. 3A-3E and 4 include 3D memory devices 100, 200 and 250 depicted in FIGS. 1, 2A and 2B. FIGS. 3A-3E and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a dielectric deck is formed on a substrate. The substrate can be a silicon substrate. The dielectric deck can include a plurality of interleaved sacrificial layers and dielectric layers. In some embodiments, each of the sacrificial layers includes silicon nitride, and each of the dielectric layers includes silicon oxide.

Figure 3A:
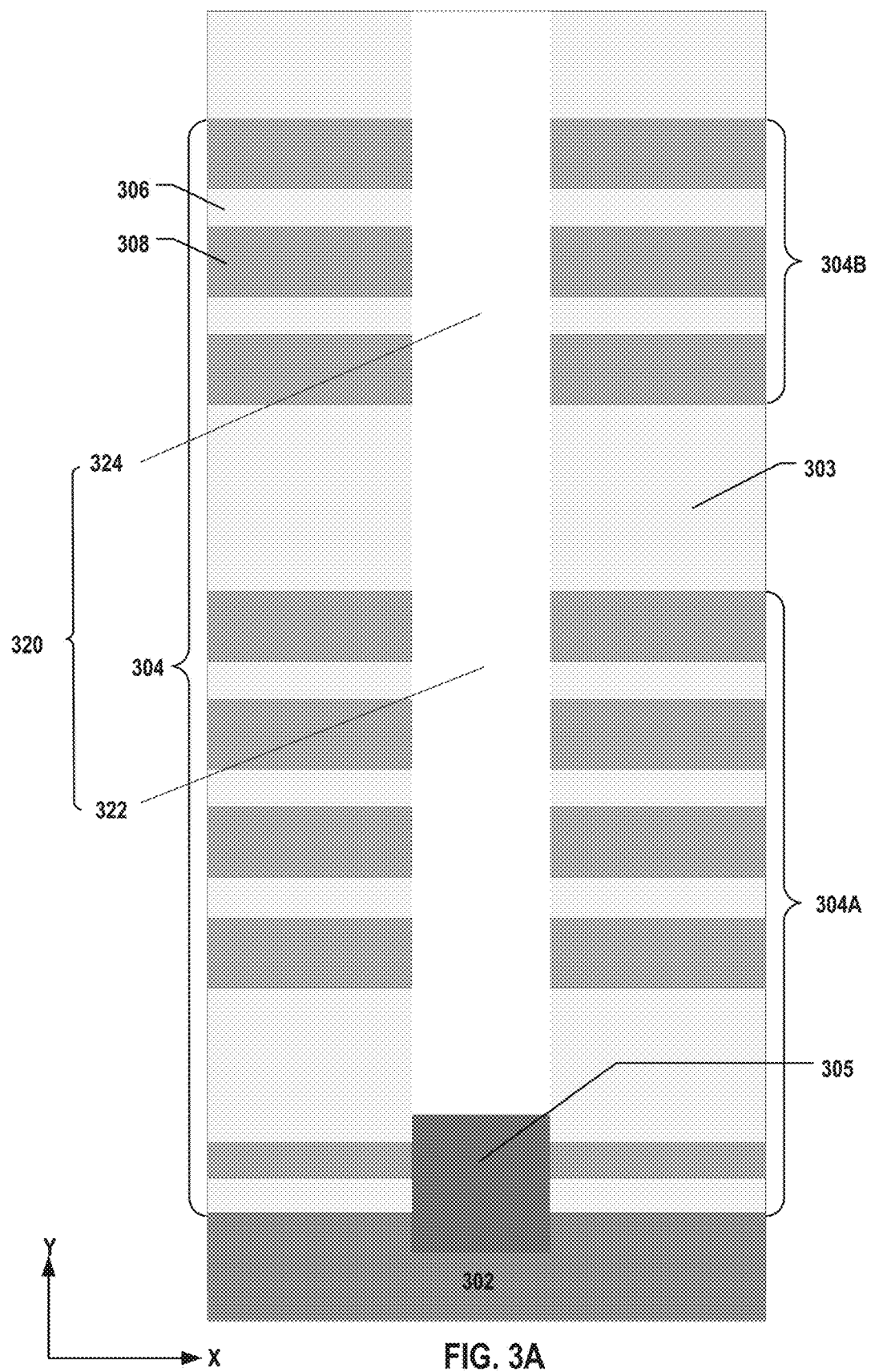
FIGS. 3A-3F illustrate an exemplary fabrication process for forming a 3D memory device with an enlarged joint critical dimension, according to some embodiments of the present disclosure.
Figure 3B:
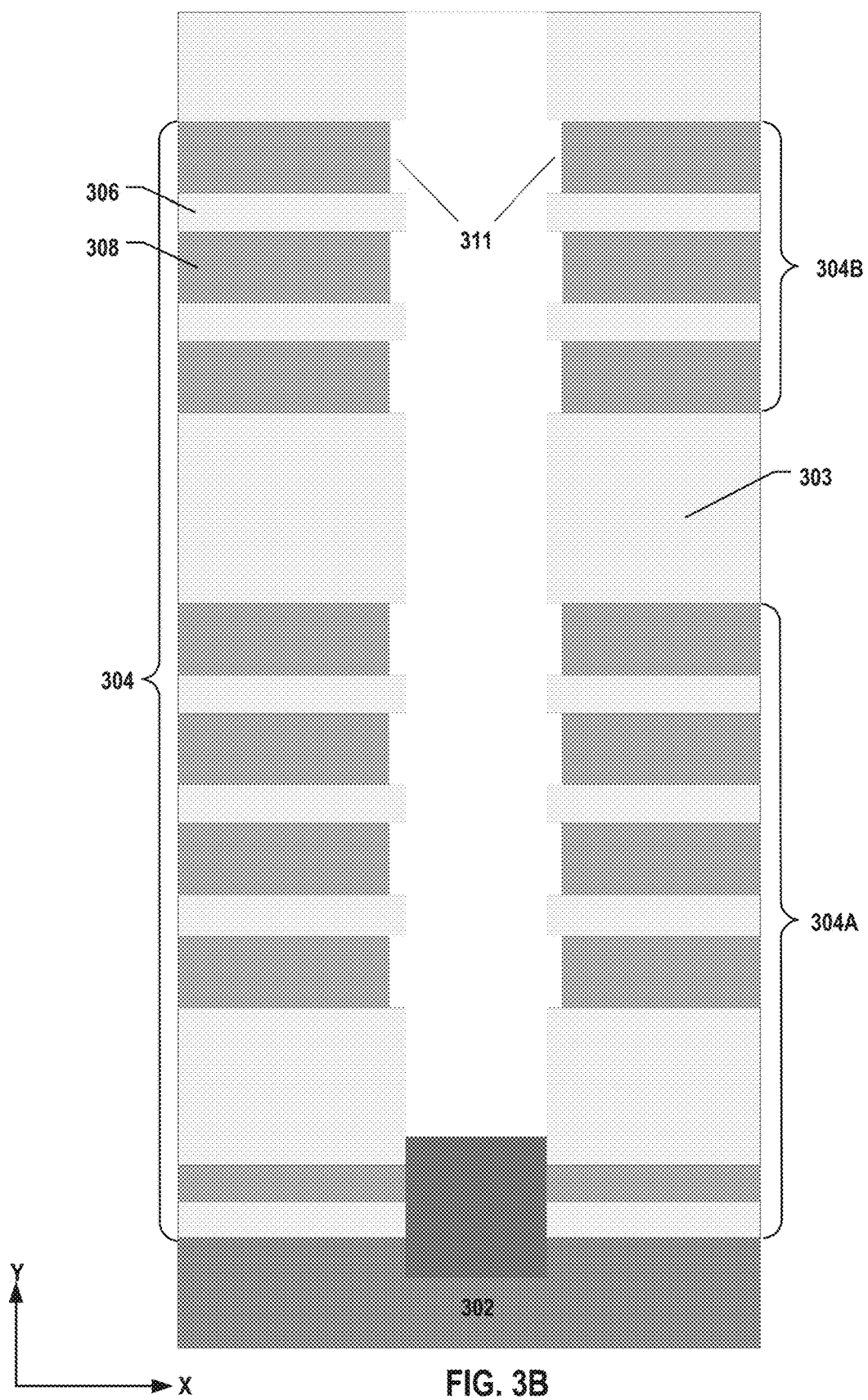
Figure 3C:
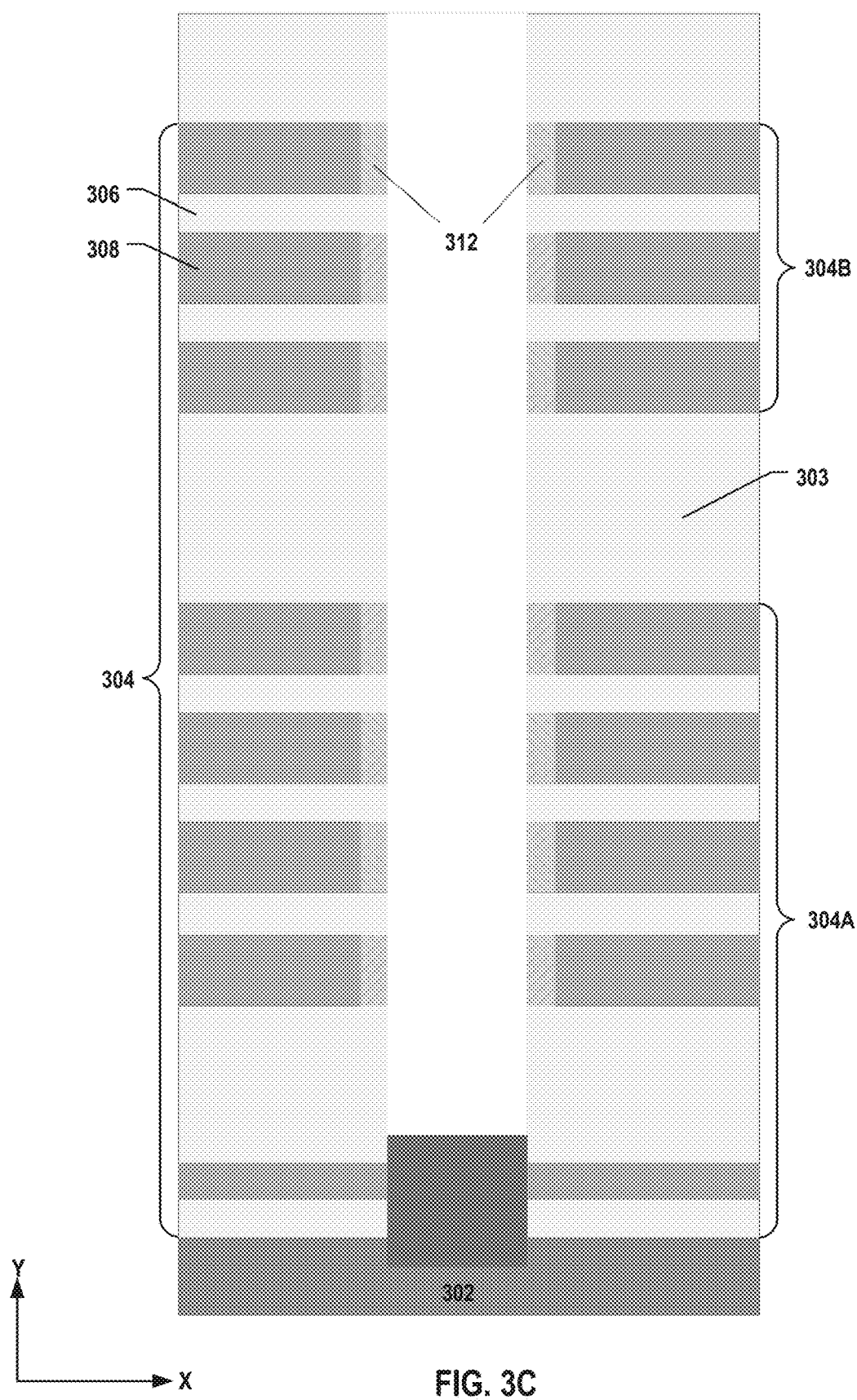
Figure 3D:
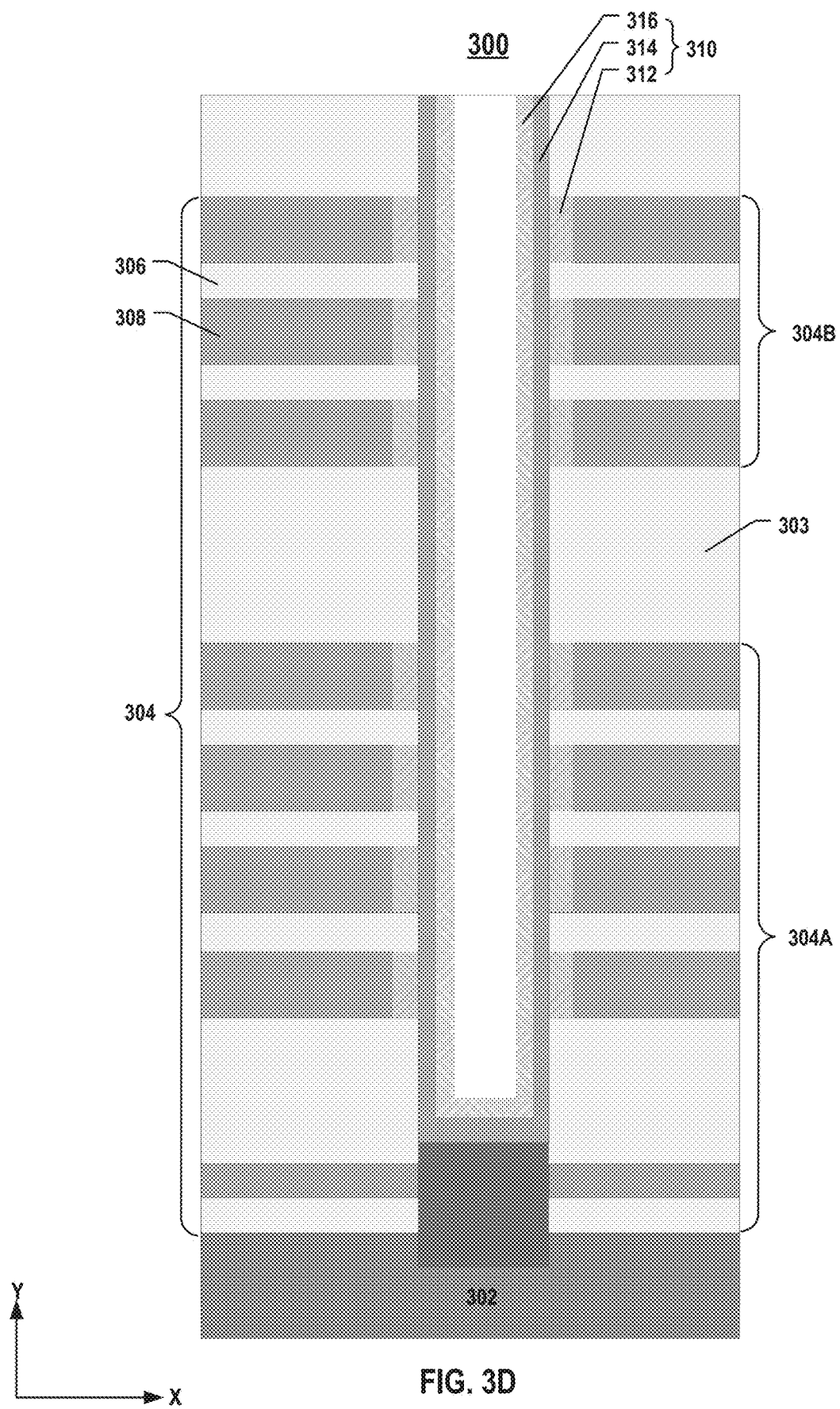
Figure 4:
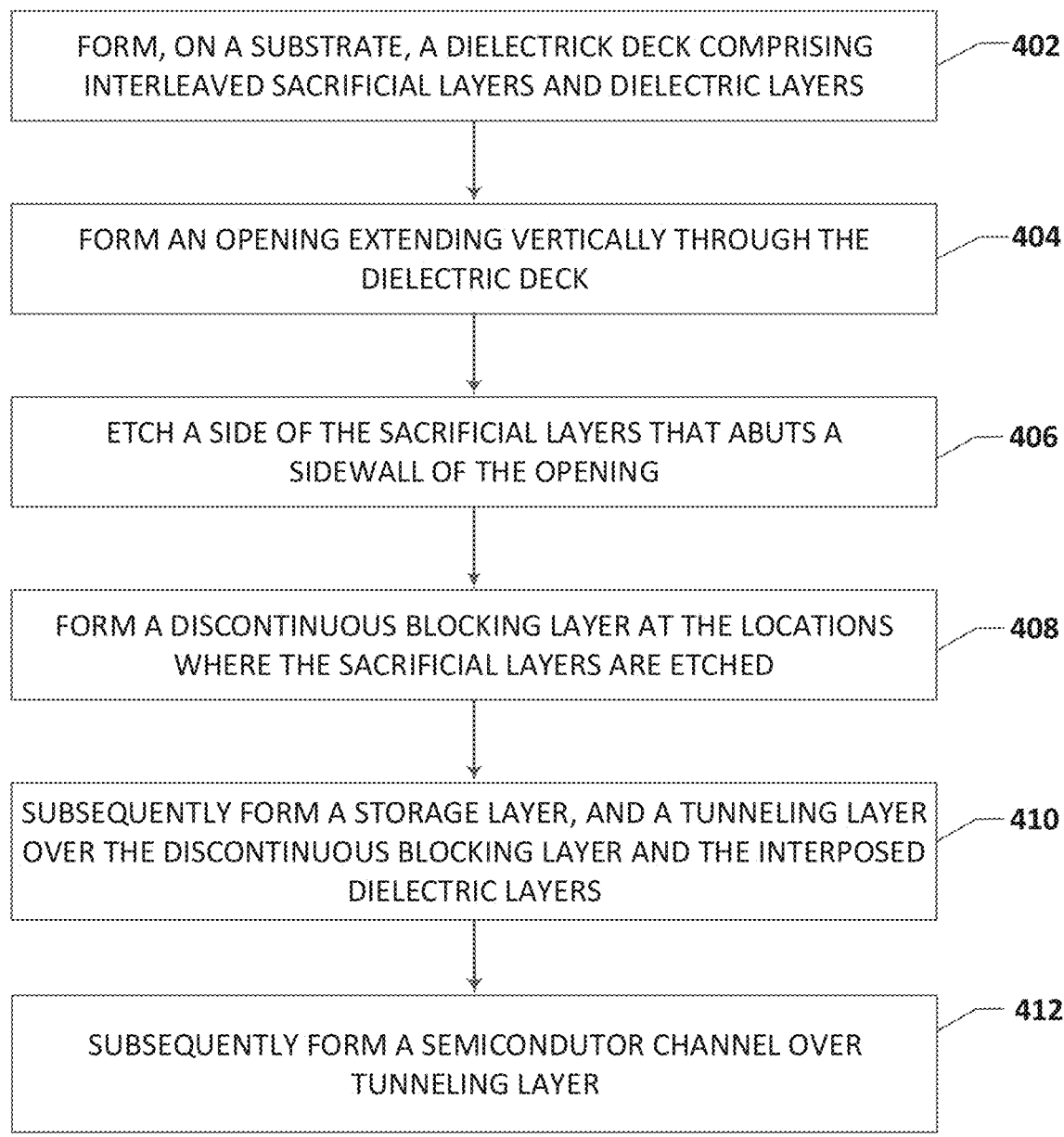
FIG. 4 illustrates a flowchart of an exemplary method for forming a 3D memory device with an enlarged joint critical dimension, according to some embodiments of the present disclosure.

Referring to FIG. 3A, 3D memory device 300 during the fabrication process can include a dual-deck dielectric stack 304 (including a lower dielectric deck 304A and an upper dielectric deck 304B), according to some embodiments of the present disclosure. Each of lower and upper dielectric decks 304A and 304B can include a plurality pairs of a dielectric layer 306 and a sacrificial layer 308 (referred to herein as "dielectric layer pairs") formed above a silicon substrate 302. Dielectric layers 306 and sacrificial layers 308 can be alternatively deposited on silicon substrate 302. In some embodiments, an insulation layer (not shown) may be formed between dielectric stack 304 and silicon substrate 302 by depositing dielectric materials, such as silicon oxide, or thermal oxidation, on silicon substrate 302 prior to the formation of dielectric stack 304. In some embodiments, each dielectric layer 306 includes a layer of silicon oxide, and each sacrificial layer 308 includes a layer of silicon nitride. Dielectric stack 304 can be formed by one or more thin film deposition processes including, but not limited to, CVD, PVD, ALD, or any combination thereof.

Method 400 proceeds to operation 404, as illustrated in FIG. 4, in which an opening extending vertically through the dielectric deck is formed. As illustrated in FIG. 3A, a channel hole 320 is an opening formed extending vertically through dielectric stack 304. Channel hole 320 can include an upper channel hole 324 and a lower channel hole 322. In some embodiments, a plurality of openings are formed through dielectric stack 304 such that each opening becomes the location for growing an individual NAND memory string in the later process. In some embodiments, fabrication processes for forming channel holes 320 include wet etching and/or dry etching, such as deep-ion reactive etching (DRIE). In some embodiments, channel hole 320 extends further through the top portion of silicon substrate 302. The etching process through dielectric stack 304 may not stop at the top surface of silicon substrate 302 and may continue to etch part of silicon substrate 302. In some embodiments, a separate etching process is used to etch part of silicon substrate 302 after etching through dielectric stack 304.

In some embodiments, a semiconductor plug is formed in the lower portion of the opening. The semiconductor plug can be epitaxially grown from the substrate in the lower portion of the opening. In some embodiments, the semiconductor plug is an epitaxially-grown silicon plug. As illustrated in FIG. 3A, a silicon plug 305 can be formed by filling the lower portion of lower channel hole 322 with single crystalline silicon epitaxially grown from silicon substrate 302 in any suitable directions (e.g., from bottom surface and/or side surface). The fabrication processes for epitaxially growing silicon plug 305 can include, but not limited to, vapor-phase epitaxy (VPE), liquid-phase epitaxy (LPE), molecular-beam epitaxy (MPE), or any combinations thereof.

Method 400 proceeds to operation 406, as illustrated in FIG. 4, in which a side of sacrificial layers that abuts a sidewall of the opening is etched. Since sacrificial layers include silicon nitride, an etching process that etches back silicon nitride may be performed in order to open one or more recesses of sacrificial layers in dual-deck dielectric stack. In some embodiments, one recess may be opened for each sacrificial layer.

Referring to FIG. 3B, recesses 311 can be opened via etching back sacrificial layers 308 from a side that abuts a sidewall of the opening, according to some embodiments of the present disclosure. Each recess 311 may be surrounded by two adjacent dielectric layers 306 and one side of sacrificial layer 308 of which a portion is etched. As one example of the etching process, wet etching may be performed during the fabrication process by applying to 3D memory device 300 a solution containing etchants (e.g., phosphoric acid ($H_3PO_4$)) that has a much faster etch rate (e.g., more than ten times faster) for silicon nitride than silicon oxide. Thus, the side of sacrificial layers 308 may be etched to create recesses positioned between adjacent dielectric layers 306, such as recesses 311 shown in FIG. 3B. It is understood that other etching methods, such as dry etching, may also be used to create the recesses, as long as the intended result taught by the current disclosure is achieved. The recesses are the locations where small sections of discontinuous blocking layer 312 may be subsequently formed.

In some embodiments, the horizontal depth of the recesses in sacrificial layers 308 are controlled to be between about 1 nm and about 4 nm, such as between 1 nm and 4 nm (e.g., 1 nm, 1.5 nm, 2 nm, 2.5 nm, 3 nm, 3.5 nm, 4 nm, any range bounded by the lower end by any of these values, or in any range defined by any two of these values). The depth may be controlled by the duration of the etching, because the rate of etching silicon nitride for a particular solution or etchant is known or ascertainable through experiments. For example, phosphoric acid may have an etch rate between about 1 nm and about 10 nm/min under a given temperature (e.g., ranging from 150° C. to 180° C.). Therefore, etching sacrificial layers 308 for 3 nm may take approximately 18 seconds to 3 minutes.

Method 400 proceeds to operation 408, as illustrated in FIG. 4, in which a discontinuous blocking layer is formed at the locations where the sacrificial layers are etched. The blocking layer may include the native oxide of at least some of the sacrificial layers. In some embodiments, to form the discontinuous blocking layer, parts of the sacrificial layers abutting the sidewall of the opening are oxidized to become the native oxide. The blocking layer may be formed by thermal oxidation or wet chemical oxidation. In some embodiments, the thickness of the blocking layer is between about 4 nm and about 10 nm, such as 7 nm. Together with the interposed dielectric layers 306, the blocking layer may form a continuous blocking layer along the sidewall of the channel structure.

Referring to FIG. 3C, a blocking layer 312 can be formed at the locations where the sacrificial layers 308 are etched, according to some embodiments of the present disclosure. These locations are recesses 311 opened via etching, as shown in FIG. 3B. Because recesses 311 are interposed by dielectric layers 306 and not continuous, blocking layer 312 formed therein are also discontinuous and may include multiple small sections, with adjacent sections along the vertical direction being separated by dielectric layers 306. In some embodiments, the number of small sections may be equal to the number of sacrificial layers 308 along the vertical direction. Each small section abuts a storage layer 314 (shown in FIG. 3D) on one end and abuts a side of one layer of sacrificial layer 308 (and subsequently a conductor layer 309 that replaces that sacrificial layer 308) on the other end, and is located in the recess of that sacrificial layer 308.

In some embodiments, none of the adjacent small sections of blocking layer 312 is contiguous with each other, and thus blocking layer 312 is fully discontinuous, as discussed above in conjunction with FIG. 2A. In some other embodiments, at least two adjacent small sections are connected via a contiguous vertical layer (not shown in FIG. 3C) that protrudes from the small sections and covers a side of the dielectric layer positioned between the two adjacent small sections, and thus blocking layer 312 is partially discontinuous, as discussed above in conjunction with FIG. 2B.

In some embodiments, the thickness of discontinuous blocking layer 312 may be between about 4 nm and about 10 nm, such as between 4 nm and 10 nm (e.g., 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, any range bounded by the lower end by any of these values, or in any range defined by any two of these values). In other embodiments, discontinuous blocking layer 312 may have a thickness between about 6 nm and about 8 nm, which is closer to the thickness of 7 nm in blocking layer 112 (shown in FIG. 1) and thus no significant change in subsequent manufacturing processes are needed. Similar to 3D memory device 200, the CD and the joint CD of the channel holes in 3D memory devices fabricated by method 400 may have a gain of twice the saved thickness of blocking layer 312, which ranges between about 8 nm and about 20 nm. Compared with FIG. 1, the CD and the joint CD may have a gain of about 14 nm.

According to the present disclosure, the small sections of discontinuous blocking layer 312 may be formed by oxidizing the etched side of sacrificial layers 308 in order to form native oxide with the thickness in the ranges described above. In some embodiments, the native oxide of parts of sacrificial layers 308 abutting the recesses 311 is oxidized by a thermal oxidation process. Either dry oxidation using molecular oxygen as the oxidant or wet oxidation using water vapor as the oxidant can be used to form the native oxide at a temperature, for example, not greater than about 850° C. In some embodiments, the thermal oxidation is performed between about 500° C. and about 850° C., such as between 500° C. and 850° C. (e.g., 500° C., 550° C., 600° C., 650° C., 700° C., 750° C., 800° C., 850° C., any range bounded by the lower end by any of these values, or in any range defined by any two of these values). In some embodiments, the thermal oxidation is performed at about 700° C., such as 700° C. As thermal oxide incorporates silicon consumed from dielectric stack 304 and oxygen supplied from the ambient, small sections of discontinuous blocking layer 312 can grow both to into the tip end of sacrificial layers 308 from its etched side and towards channel hole 320, resulting in part of the native oxide layer thickness lying over the location of forming recesses 311 and part inside sacrificial layers 308. The thickness of the resulting native oxide layer can be controlled by the thermal oxidation temperature and/or time, an example of which has already been described above. In one example, the tip end of sacrificial layers 308 being oxidized may have a thickness of about 3 nm to about 6 nm (e.g., 3 nm, 3.5 nm, 4 nm, 4.5 nm, 5 nm, 5.5 nm, 6 nm, any range bounded by the lower end by any of these values, or in any range defined by any two of these values), so that the resulting native oxide layer may have a thickness between about 4 nm and about 10 nm when the horizontal depth of recesses 311 in sacrificial layers 308 are controlled to be between about 1 nm and about 4 nm.

In some embodiments, the native oxide of parts of sacrificial layers 308 abutting recesses 311 is oxidized by a wet chemical oxidation process. Wet chemicals including ozone can be used to oxidize parts of sacrificial layers 308 abutting recesses 311 to form native oxide. In some embodiments, the wet chemical is a mixture of hydrofluoric acid and ozone (e.g., FOM). For example, hydrofluoric acid has a concentration of 49% in the ultra-pure water. The thickness of the resulting native oxide layer can be controlled by the wet chemical compositions, temperature, and/or time. It is understood that small sections of discontinuous blocking layer 312 can be formed using any other suitable processes, such as in situ steam generation (ISSG) process, which uses oxygen gas and hydrogen gas to create water in the form of steam.

In some embodiments, sacrificial layers 308 include silicon nitride, and dielectric layers 306 include silicon oxide. Oxidation of the silicon nitride in sacrificial layers 308 can generate silicon oxynitride, which can remain in discontinuous blocking layer 312 with silicon oxide, or partially or fully removed from discontinuous blocking layer 312 using any suitable processes. Nevertheless, discontinuous blocking layer 312 and dielectric layers 306 may collectively form a continuous blocking layer along the sidewall of the channel structure.

According to some embodiments of the present disclosure, discontinuous blocking layer 312 may extend through both upper and lower dielectric decks 304B and 304A vertically and along a sidewall of the NAND memory string, as shown in FIG. 3C. This configuration has the advantage of preventing the entire sidewall of the channel structure from being etched in the subsequent fabrication process.

In some embodiments, discontinuous blocking layer 312 may be formed so that its sidewall is substantially flush with the sidewall of joint oxide layer 303. This configuration makes it possible to achieve thickness uniformity of storage layer 314 (shown in FIG. 3D) and/or tunneling layer 316 (shown in FIG. 3D) in the joint CD area. As a result, memory film 310 (shown in FIG. 3D) is unlikely to have breakage in the joint CD area, which would otherwise cause defects in 3D memory device 300.

In some embodiments, discontinuous blocking layer 312 may be formed so that its sidewall may be substantially flush with the sidewall of dielectric layers 206. Similar to the embodiments above, this configuration makes it possible to achieve thickness uniformity of storage layer 314 and/or tunneling layer 316 in the entire vertical area across the channel structure. As a result, memory film 310 is unlikely to have breakage in the channel structure, which would otherwise cause defects in 3D memory device 300.

Method 400 proceeds to operation 410, as illustrated in FIG. 4, in which a blocking layer, a storage layer, and a tunneling layer are subsequently formed in this order over the discontinuous blocking layer and the interposed dielectric layers and along the sidewall of the opening. In some embodiments, to form the storage layer, a silicon nitride layer or a silicon oxynitride layer is deposited over the discontinuous blocking layer and the interposed dielectric layers.

Referring to FIG. 3D, a memory film 310 (including discontinuous blocking layer 312, storage layer 314, and tunneling layer 316) is formed along the sidewall of channel hole 320 (shown in FIG. 3A). Storage layer 314 (e.g., a silicon nitride layer or a silicon oxynitride layer) and tunneling layer 316 (e.g., a silicon oxide layer) can be subsequently deposited in this order using one or more thin film deposition processes, such as ALD, CVD, PVD, any other suitable processes, or any combination thereof, over discontinuous blocking layer 312 and interposed dielectric layers 306. In some embodiments, a silicon nitride layer or a silicon oxynitride layer is deposited over discontinuous blocking layer 312 and interposed dielectric layers 306 as storage layer 314. In some embodiments, memory film 310 can fully cover the sidewall of channel hole 320.

Method 400 proceeds to operation 412, as illustrated in FIG. 4, in which a semiconductor channel is subsequently formed over the tunneling layer.

Figure 3E:
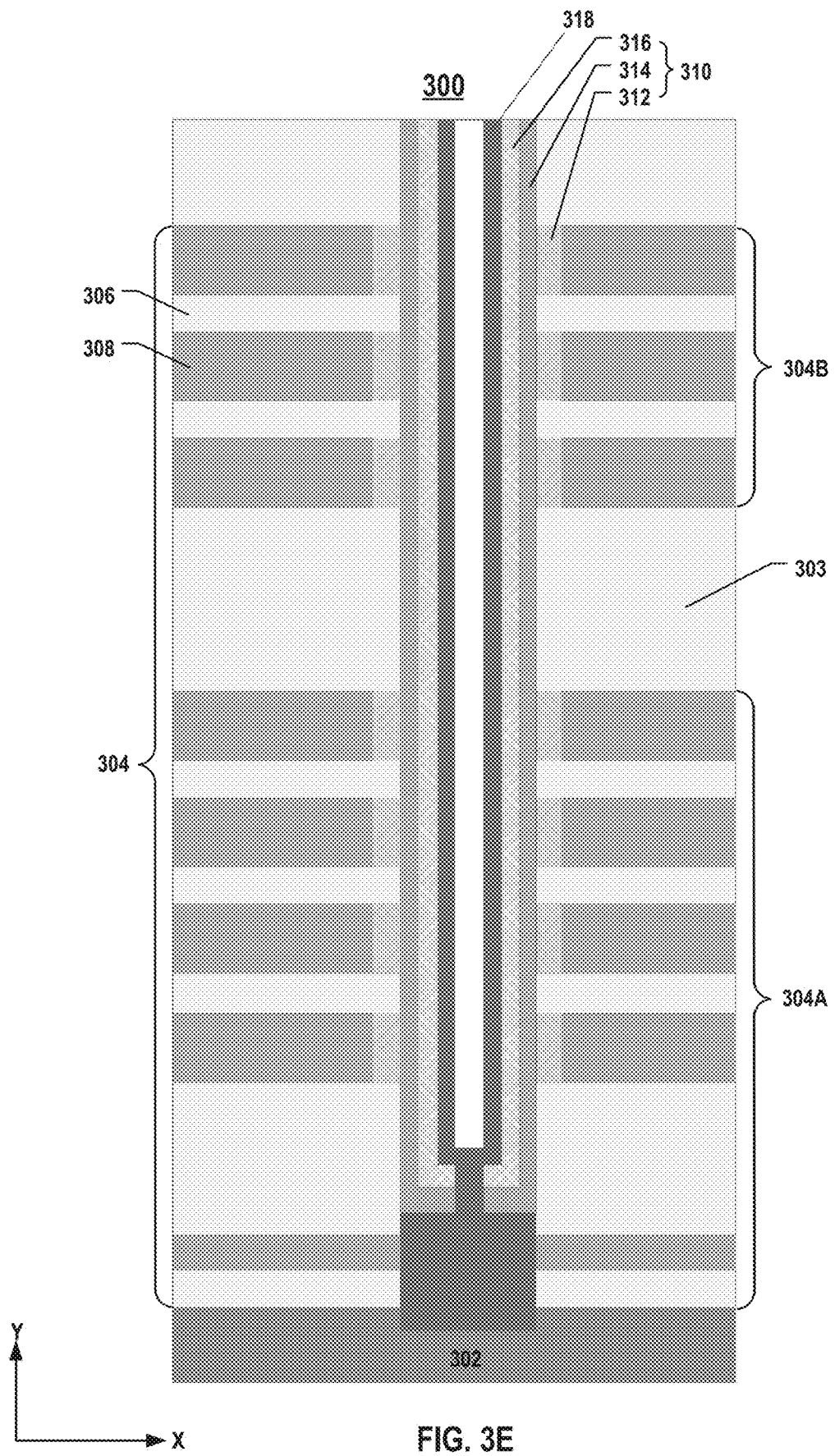

As illustrated in FIG. 3E, semiconductor channel 318 can be formed over tunneling layer 316 of memory film 310 using one or more thin film deposition processes, such as CVD, PVD, ALD, electroplating, electroless plating, or any combination thereof. In some embodiments, semiconductor channel 318 includes polysilicon. In some embodiments, a capping layer (not shown), such as a silicon oxide layer, may be formed in channel hole 320 to fully or partially fill the remaining space of channel hole 320 using one or more thin film deposition processes, such as CVD, PVD, ALD, electroplating, electroless plating, or any combination thereof. A channel structure including discontinuous blocking layer 312, storage layer 314, tunneling layer 316, semiconductor channel 318, and capping layer is thus formed as shown in FIG. 3D. Discontinuous blocking layer 312 can be the outermost layer of the channel structure in contact with interleaved dielectric layers 306 and 308 of dielectric stack 304. In the present disclosure, storage layer 314 can also be in contact with interleaved dielectric layers 306 and 308 of dielectric stack 304.

Figure 3F:
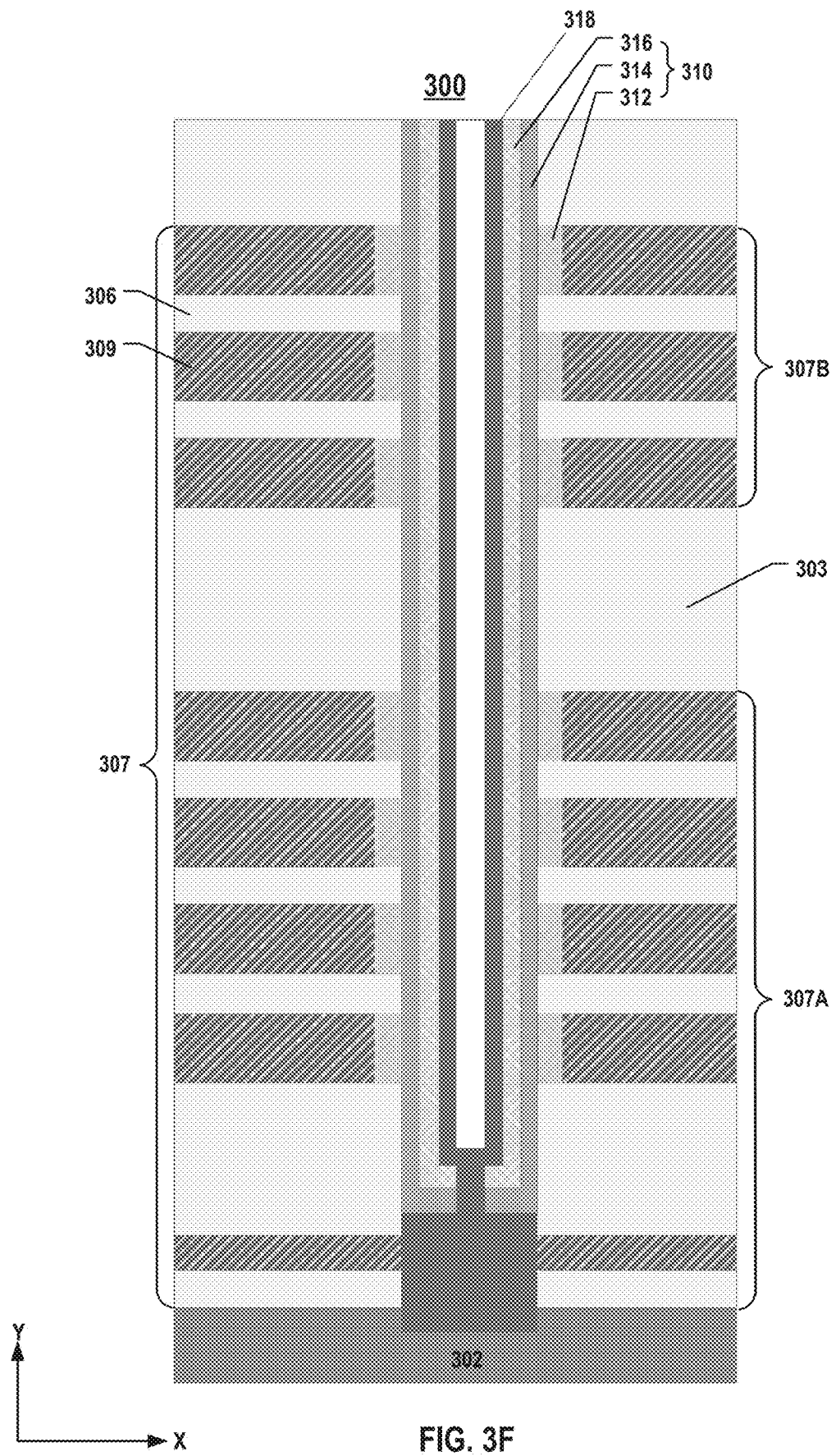

As illustrated in FIG. 3F, after the formation of the NAND memory string as shown in FIGS. 3A-3E, a dual-deck memory stack 307 can be formed by replacing sacrificial layers 308 in lower and upper dielectric decks 304A and 304B with conductor layers 309. Memory stack 307 may include interleaved conductor layers 309 and dielectric layers and may be formed by replacing, with conductor layers 309, sacrificial layers 308 in dielectric stack 304. In some embodiments, to form memory stack 307, a slit opening (e.g., a gate line slit) can be formed through dielectric stack 304, sacrificial layers 308 in dielectric stack 304 can be etched by applying the etchants through the slit opening to form a plurality of lateral recesses, and conductor layers 309 can be deposited in the lateral recesses. In some embodiments, in forming memory stack 307, the first dielectric layers of dielectric stack 304 are etched until being stopped by the native oxide layer.

According to one aspect of the present disclosure, a 3D memory device is disclosed, which includes a substrate, a memory stack having a plurality of interleaved conductor layers and dielectric layers on the substrate, and a memory string extending vertically through the first memory stack and having a memory film along a sidewall of the memory string. The memory film includes a discontinuous blocking layer interposed by the dielectric layers.

In some embodiments, the discontinuous blocking layer includes one or more sections, and at least one section is located in the recess of a conductor layer and surrounded by adjacent dielectric layers and a side of the conductor layer.

In some embodiments, the discontinuous blocking layer is fully discontinuous.

In some embodiments, the discontinuous blocking layer is partially discontinuous.

In some embodiments, the thickness of the discontinuous blocking layer is between about 4 nm and about 10 nm.

In some embodiments, the memory film further includes a storage layer and a tunneling layer.

In some embodiments, at least one of the discontinuous blocking layer and the dielectric layers includes silicon oxide.

In some embodiments, the memory stack includes an upper deck and a lower deck separated by a joint oxide layer. The discontinuous blocking layer extends through the upper and lower decks, and the sidewall of the discontinuous blocking layer is substantially flush with the sidewall of the joint oxide layer.

In some embodiments, the sidewall of the discontinuous blocking layer is substantially flush with the sidewall of the dielectric layers.

According to another aspect of the present disclosure, a 3D memory device is disclosed, which includes a substrate, a memory stack having a plurality of interleaved conductor layers and dielectric layers on the substrate, and a memory string extending vertically through the first memory stack and having a memory film along a sidewall of the memory string. The memory film includes a discontinuous blocking layer interposed by the dielectric layers. The discontinuous blocking layer has multiple sections, and none of the adjacent sections is contiguous with each other.

In some embodiments, the thickness of the discontinuous blocking layer is between about 4 nm and about 10 nm.

In some embodiments, the memory film further includes a storage layer and a tunneling layer.

In some embodiments, at least one of the discontinuous blocking layer and the dielectric layers includes silicon oxide.

In some embodiments, the memory stack includes an upper deck and a lower deck separated by a joint oxide layer. The discontinuous blocking layer extends through the upper and lower decks, and the sidewall of the discontinuous blocking layer is substantially flush with the sidewall of the joint oxide layer.

In some embodiments, the sidewall of the discontinuous blocking layer is substantially flush with the sidewall of the dielectric layers.

According to another aspect of the present disclosure, a method for forming a 3D memory device is disclosed. A dielectric deck comprising interleaved sacrificial layers and dielectric layers is formed on a substrate. An opening extending vertically through the first dielectric deck is formed. A side of the sacrificial layers that abuts a sidewall of the opening is etched. A discontinuous blocking layer is formed at the locations where the sacrificial layers are etched. A storage layer, a tunneling layer, and a semiconductor channel is subsequently formed over the discontinuous blocking layer and the interposed dielectric layers.

In some embodiments, the discontinuous layer includes one or more sections, and at least one section is formed in the recess of a conductor layer and surrounded by adjacent dielectric layers and a side of the conductor layer.

In some embodiments, the discontinuous blocking layer is fully discontinuous.

In some embodiments, the discontinuous blocking layer is partially discontinuous.

In some embodiments, a memory stack having interleaved conductor layers and the dielectric layers is formed by replacing, with the conductor layers, the sacrificial layers in the dielectric stack.

In some embodiments, the side of the sacrificial layers that abuts the sidewall of the opening is etched for about 1 nm to 4 nm.

In some embodiments, forming the discontinuous blocking layer includes oxidizing the etched side of the sacrificial layers.

In some embodiments, the discontinuous blocking layer is formed by one of thermal oxidation or wet chemical oxidation.

In some embodiments, a thickness of the sacrificial layers being oxidized is about 3 nm to about 6 nm.

In some embodiments, a thickness of the discontinuous blocking layer is between about 4 nm and about 10 nm.

In some embodiments, at least one of the discontinuous blocking layer and the dielectric layers includes silicon oxide.

In some embodiments, the sacrificial layers include silicon nitride.

In some embodiments, the method for forming the 3D memory device further includes, prior to etching the side of the sacrificial layers, forming a semiconductor plug in a lower portion of the opening.

In some embodiments, the dielectric deck includes an upper deck and a lower deck separated by a joint oxide layer. The discontinuous blocking layer extends through the upper and lower decks, and the sidewall of the discontinuous blocking layer is substantially flush with the sidewall of the joint oxide layer.

In some embodiments, the sidewall of the discontinuous blocking layer is substantially flush with the sidewall of the dielectric layers.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate;
a memory stack comprising a plurality of interleaved conductor layers and dielectric layers on the substrate; and
a memory string extending vertically through the memory stack and comprising a memory film along a sidewall of the memory string,
wherein the memory film comprises a discontinuous blocking layer interposed by the dielectric layers and a storage layer,
wherein the memory stack comprises an upper deck and a lower deck separated by a joint oxide layer, and
wherein a vertical sidewall of the joint oxide layer is in contact with the storage layer.

2. The 3D memory device of claim 1, wherein the discontinuous blocking layer comprises one or more sections, and
wherein at least one section is located in a recess of at least one of the conductor layers and surrounded by adjacent dielectric layers and a side of the at least one of the conductor layers.

3. The 3D memory device of claim 1, wherein a thickness of the discontinuous blocking layer is between about 4 nm and about 10 nm.

4. The 3D memory device of claim 1, wherein the memory film further comprises a tunneling layer.

5. The 3D memory device of claim 1, wherein at least one of the discontinuous blocking layer and the dielectric layers comprises silicon oxide.

6. The 3D memory device of claim 1,
wherein the discontinuous blocking layer extends through the upper and lower decks, and
wherein a sidewall of the discontinuous blocking layer is substantially flush with the vertical sidewall of the joint oxide layer.

7. The 3D memory device of claim 6, wherein the sidewall of the discontinuous blocking layer is substantially flush with a sidewall of the dielectric layers.

8. A three-dimensional (3D) memory device, comprising:
a substrate;
a memory stack comprising a plurality of interleaved conductor layers and dielectric layers on the substrate; and
a memory string extending vertically through the first memory stack and comprising a memory film along a sidewall of the memory string,
wherein the memory film comprises a discontinuous blocking layer interposed by the dielectric layers and a storage layer,
wherein the discontinuous blocking layer comprises multiple sections,
wherein none of adjacent sections from the multiple sections is contiguous with each other,
wherein the memory stack comprises an upper deck and a lower deck separated by a joint oxide layer, and
wherein a vertical sidewall of the joint oxide layer is in contact with the storage layer.

9. The 3D memory device of claim 8,
wherein the discontinuous blocking layer extends through the upper and lower decks, and
wherein a sidewall of the discontinuous blocking layer is substantially flush with the vertical sidewall of the joint oxide layer.

10. A method for forming a three-dimensional (3D) memory device, comprising:
forming a dielectric stack comprising interleaved sacrificial layers and dielectric layers on a substrate, wherein the dielectric stack comprises an upper deck and a lower deck separated by a joint oxide layer;
forming an opening extending vertically through the dielectric stack;
etching a side of the sacrificial layers that abuts a sidewall of the opening;
forming a discontinuous blocking layer at locations where the sacrificial layers are etched; and
subsequently forming a storage layer, a tunneling layer, and a semiconductor channel over the discontinuous blocking layer and the dielectric layers, wherein a vertical sidewall of the joint oxide layer is in contact with the storage layer.

11. The method of claim 10, wherein the discontinuous blocking layer comprises one or more sections, and
wherein at least one section is formed in a recess of at least one of the sacrificial layers and surrounded by adjacent dielectric layers and a side of the at least one of the sacrificial layers.

12. The method of claim 10, further comprising:
forming a memory stack comprising interleaved conductor layers and the dielectric layers by replacing, with the conductor layers, the sacrificial layers in the dielectric stack.

13. The method of claim 10, wherein the side of the sacrificial layers that abuts the sidewall of the opening is etched for about 1 nm to about 4 nm.

14. The method of claim 10, wherein forming the discontinuous blocking layer comprises oxidizing the etched side of the sacrificial layers.

15. The method of claim 14, wherein the discontinuous blocking layer is formed by one of thermal oxidation or wet chemical oxidation.

16. The method of claim 14, wherein a thickness of the sacrificial layers being oxidized is about 3 nm to about 6 nm.

17. The method of claim 10, wherein at least one of the discontinuous blocking layer and the dielectric layers comprises silicon oxide.

18. The method of claim 10, wherein the sacrificial layers comprise silicon nitride.

19. The method of claim 10, further comprising, prior to etching the side of the sacrificial layers, forming a semiconductor plug in a lower portion of the opening.

20. The method of claim 10,
wherein the discontinuous blocking layer extends through the upper and lower decks, and
wherein a sidewall of the discontinuous blocking layer is substantially flush with the vertical sidewall of the joint oxide layer.

* * * * *